United States Patent
Mehta et al.

(10) Patent No.: US 10,236,891 B1
(45) Date of Patent: Mar. 19, 2019

(54) LOCK TIME MEASUREMENT OF CLOCK AND DATA RECOVERY CIRCUIT

(71) Applicant: Synopsys, Inc., Mountain View, CA (US)

(72) Inventors: Ravi Mehta, Karnataka (IN); Manjunath Shet SN, Karnataka (IN); Biman Chattopadhyay, Karnataka (IN); Vishal Dilipbhai Nimbark, Karnataka (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/863,422

(22) Filed: Jan. 5, 2018

(30) Foreign Application Priority Data

Sep. 21, 2017 (IN) .............................. 201741033501

(51) Int. Cl.
  *H04L 7/00* (2006.01)
  *H03L 7/08* (2006.01)
  *H04L 7/04* (2006.01)

(52) U.S. Cl.
  CPC .............. *H03L 7/0807* (2013.01); *H04L 7/04* (2013.01)

(58) Field of Classification Search
  CPC ................................ H03L 7/0807; H04L 7/04
  USPC ............... 375/219, 221, 259, 233, 375, 376; 710/71, 106; 714/699, 708, 733; 370/359, 389
  See application file for complete search history.

(56) References Cited

U.S. PATENT DOCUMENTS

| | | | | |
|---|---|---|---|---|
| 7,848,394 B2* | 12/2010 | Clancy | ................... | H03M 9/00 327/101 |
| 2010/0150549 A1* | 6/2010 | Lee | ........................ | G11C 29/32 398/25 |
| 2011/0199138 A1* | 8/2011 | Sano | ........................ | H03L 7/07 327/158 |
| 2012/0216084 A1* | 8/2012 | Chun | ....................... | H04L 25/02 714/708 |

OTHER PUBLICATIONS 65.3.3 Test, Directory of pdfs referenced by D1.414 comments, IEEE 802.3ah Ethernet in the First Mile Task Force Comments Against Draft Documents, Apr. 28, 2003, pp. 1-2.
AR# 66699: How to check that the CDR is locked to incoming data, Xilinx support answers, Mar. 22, 2016, pp. 1-2.

* cited by examiner

*Primary Examiner* — Dhaval V Patel
(74) *Attorney, Agent, or Firm* — Fenwick & West LLP

(57) ABSTRACT

A lock time measurement system to determine a lock time includes a measurement device, a serializer-deserializer (SERDES), a pattern generator, and a splitter. In a first mode, the SERDES receives first data from the pattern generator by way of the splitter. A receiver of the SERDES outputs a recovered clock signal based on the first data to a transmitter. The transmitter includes a serializer and a multiplexer. The serializer receives the recovered clock signal by way of the multiplexer and modifies second data based on the recovered clock signal and outputs serial data. A measurement device, connected to the transmitter and the splitter determines the lock time. In a second mode, the SERDES functions as a transmitter for transmitting data and a receiver for receiving data in a communication link. The system has a better accuracy and utilizes existing receiver and driver circuits.

15 Claims, 1 Drawing Sheet

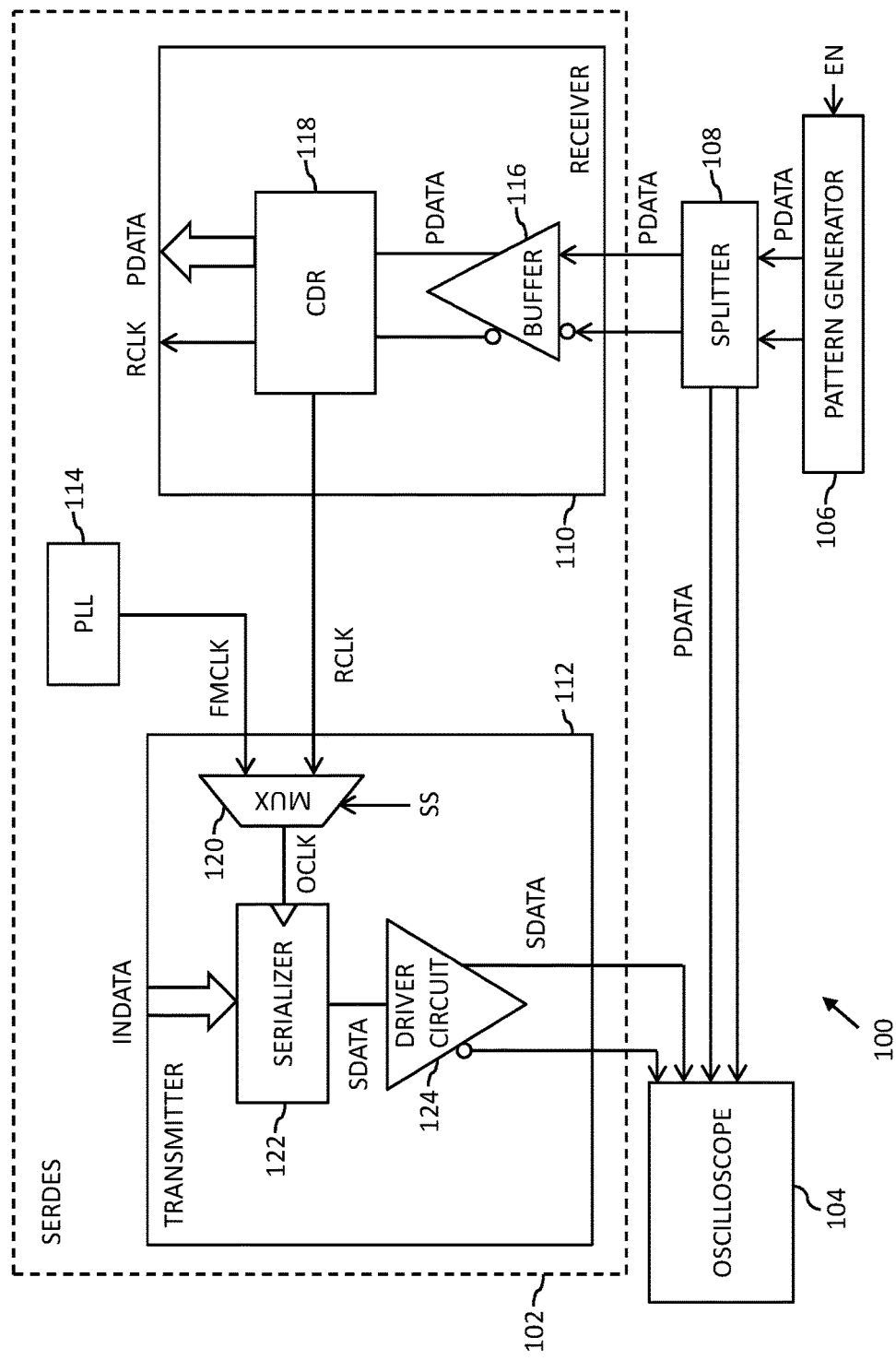

LOCK TIME MEASUREMENT OF CLOCK AND DATA RECOVERY CIRCUIT

CROSS-RELATED APPLICATIONS

This application claims priority of Indian Application No. 201741033501, filed Sep. 21, 2017, the contents of which are incorporated herein by reference.

FIELD OF THE INVENTION

The present invention generally relates to data transmission systems, and more particularly, to measurement of lock time of a clock and data recovery circuit used in serial communication links.

DESCRIPTION OF THE RELATED ART

Data communication involves transmission of data from a transmitter at one end of a network to a receiver at another end of the network. Generally, in a high-speed data communication system, the data is transmitted without an accompanying clock signal. Absence of the clock signal may result in under-sampling or over-sampling of the data. A clock and data recovery (CDR) circuit is commonly used for generating an appropriate clock signal by the receiver to sample data received from the transmitter. A CDR circuit generates a clock signal that is frequency and phase synchronized with the data received from the transmitter. Further, a high-speed receiver of the high-speed data communication system samples the data at the frequency of the clock signal.

A point-to-multipoint communication network, such as a passive optical network (PON) is an example of a high-speed data communication system that employs a CDR circuit. The PON typically includes a single head-end facility that broadcasts data by way of downstream signals to multiple end-user stations. The downstream signals include a plurality of bits arranged in sequence referred to as serial data frames. The head-end facility transmits downstream data to the end-user stations in a continuous mode. Hence, CDR circuits in the end-user stations have sufficient time to get frequency and phase synchronized to frequency and phase of the downstream signal, respectively. When an end user station transmits signals, such as upstream signals to the head-end facility, the signals are usually transmitted in burst mode. Burst mode is a temporary high-speed data transmission mode used for facilitating sequential data transfer at a high throughput. The upstream signals include a plurality of bits arranged in sequence as serial data frames. Since a large amount of upstream data is sent by the multiple end user stations in a short period of time, a CDR circuit on the head-end facility must be frequency and phase synchronized with the upstream signal. If the phase of the clock signal is not synchronized with the upstream signal, the clock signal may over-sample or under-sample the upstream signal. This leads to an error or corruption of data sampled from the upstream signal. Therefore, the CDR circuit must synchronize the frequency and phase with the upstream signal in a short period of time.

Generally, the receiver of the high-speed data communication, such as the head-end facility generates a clock signal that is frequency-synchronized with the upstream signal. The frequency-synchronized clock signal is referred to as 'recovered clock signal'. The head-end facility further phase-synchronizes the clock signal with the upstream signal. The head-end facility utilizes a certain amount of time to synchronize the phase of the clock signal with that of the upstream signal. This time taken by the receiver is referred to as 'lock time' of the receiver. Once the clock signal is phase-synchronized with the upstream signal, the head-end facility is phase-locked to the upstream signal. If the head-end facility samples the upstream signal before it is phase-locked, the serial data frames can be corrupted due to frequency and phase mismatch between the clock signal and the upstream signal. Thus, the data locking of a receiver with the upstream signal validates the serial data frames and thereby establishes a valid serial communication link. The upstream signals are also referred to as 'expected data'. Generally, it is difficult to determine the lock time accurately.

One solution known in the art for determining the lock time is by way of reducing the frequency of the recovered clock using decoders, such as 8B/10B decoders. Further, the recovered clock at reduced frequency is received as recovered data and is compared with the expected data for determining the lock time. One of the disadvantages of this method is the reduction in accuracy of the lock time measurement. This reduction of accuracy occurs due to the reduction of the frequency of the clock signal. Further, this method is not reliable when the expected data is not known beforehand.

Another known solution to determine the clock time implements additional circuits such as a clock driver block. The clock driver block outputs the recovered clock signal. The recovered clock signal is then compared with the expected data to determine the lock time. One of the disadvantages of such a system is the increased complexity of the circuit. The additional circuit further increases the overall area of the solution.

In light of the foregoing, there exists a need for an efficient and inexpensive method for measuring the lock time of a CDR circuit. Further, there is a need for a lock time measurement system with less complexity compared to the prior art solutions and that retains the accuracy of the lock time measurement.

SUMMARY

In one embodiment, the present invention provides a lock time measurement system. The lock time measurement system includes a receiver and a transmitter. The receiver includes a clock and data recovery (CDR) circuit. The lock time measurement system measures the lock time of the CDR circuit. The CDR circuit receives first data and outputs a recovered clock signal based on the first data. The transmitter is connected to the CDR circuit and receives a reference clock signal and the recovered clock signal. The transmitter includes a multiplexer and a serializer. The multiplexer receives the recovered clock signal, the reference clock signal, and a select signal. Further, the multiplexer outputs at least one of the recovered clock signal and the reference clock signal as output clock signal based on the select signal. The serializer, connected to the multiplexer, receives second data and the output clock signal, and outputs serial data. The serial data and the first data are used for measuring the lock time of the CDR circuit.

In another embodiment, the present invention provides a serializer-deserializer (SERDES). The SERDES includes a receiver, a phase locked loop (PLL), and a transmitter. The receiver includes a clock and data recovery (CDR) circuit that receives first data and outputs a recovered clock signal based on the first data. The phase locked loop (PLL) outputs a reference clock signal to the transmitter. The transmitter is connected to the CDR circuit and receives the reference clock signal and the recovered clock signal. The transmitter includes a multiplexer and a serializer. The multiplexer receives the recovered clock signal, the reference clock signal, and a select signal. Further, the multiplexer outputs at least one of the recovered clock signal and the reference clock signal as output clock signal based on the select signal. The serializer, connected to the multiplexer, receives second data and the output clock signal, and outputs serial data. The serial data and the first data are used for measuring the lock time of the CDR circuit.

Various embodiments of the present invention provide a system to determine a lock time of a clock and data recovery (CDR) circuit. The system utilizes an existing transmitter present in a data communication system for measurement of the lock time. Further, input data is copied using a splitter to observe a phase of the input data relative to a phase of a recovered clock signal. The system includes a measurement device, a serializer-deserializer (SERDES), a splitter, and a pattern generator. The SERDES receives a select signal at a first logic state. The pattern generator is connected to the splitter to receive first data. The splitter receives the first data, and outputs a copy of the first data as third data to the measurement device. Further, the splitter outputs the first data to a receiver. The receiver receives and generates a recovered clock signal based on the first data and outputs the recovered clock signal to a transmitter. The transmitter includes a serializer and a multiplexer. The multiplexer receives a reference clock signal, the select signal at the first logic state, and is connected to receiver to receive the recovered clock signal. The multiplexer outputs at least one of the recovered clock signal and the reference clock signal as output clock signal, based on the select signal, for use by the transmitter. The serializer, connected to the multiplexer, receives the output clock signal therefrom and modifies a second data based on the output clock signal. Further, the serializer outputs the modified second data as serial data. The serial data is a clock type signal based on the second data and the output clock. In one embodiment, the second data can be a toggling pattern such as '010101'. The transmitter outputs the serial data based on the second data and the output clock signal. In the first mode of operation, the transmitter is connected to the measurement device to determine the lock time based on the third data and the serial data. In a second mode of operation, the transmitter receives the select signal at a second logic state, second data, and outputs the serial data to an external circuit. Further, in the second mode of operation, the transmitter receives the second data from the external circuit and the reference clock signal from a phase locked loop, and modifies and outputs the second data as the serial data based on the reference clock signal.

The system to determine the lock time of a CDR circuit does not reduce the frequency of the recovered clock for measurement of the lock time. Consequently, the accuracy of the lock time measurement remains intact. Further, the system does not require a modified driver circuit and utilizes existing analog components of a data transmission device, such as a transmitter and a multiplexer for determining the lock time of the device. Thus, the system is inexpensive and simple as compared to the prior art solutions.

BRIEF DESCRIPTION OF THE DRAWINGS

The following detailed description of the preferred embodiments of the present invention will be better understood when read in conjunction with the appended drawing. The present invention is illustrated by way of example, and not limited by the accompanying figure, in which like references indicate similar elements.

FIG. 1 is a schematic block diagram of a lock time measurement system for a clock and data recovery circuit, in accordance with an embodiment of the present invention.

DETAILED DESCRIPTION OF EMBODIMENTS

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

As used in the specification and claims, the singular forms "a", "an" and "the" include plural references unless the context clearly dictates otherwise. For example, the term "an article" may include a plurality of articles unless the context clearly dictates otherwise.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

There may be additional components described in the foregoing application that are not depicted on one of the described drawings. In the event such a component is described, but not depicted in a drawing, the absence of such a drawing should not be considered as an omission of such design from the specification.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

FIG. 1 is a schematic block diagram of a lock time measurement system 100 for a clock and data recovery (CDR) circuit, in accordance with an embodiment of the present invention. The lock time measurement system 100 includes a serializer-deserializer (SERDES) 102 connected to a measurement device 104, and a splitter 108. Further, the splitter 108 is connected to a pattern generator 106. The lock time is determined by way of the measurement device 104. In one embodiment, the measurement device 104 is an oscilloscope. The SERDES 102 includes a receiver 110, a transmitter 112, and a phase locked loop (PLL) 114. The receiver 110 includes a buffer 116 and a clock and data recovery (CDR) circuit 118. The transmitter 112 is connected to the PLL 114 and the oscilloscope 104. The transmitter 112 includes a multiplexer 120, a serializer 122, and a driver circuit 124.

The pattern generator 106 receives an enable signal (EN) and generates a sequence of bits as an input pattern of bits (PDATA). The splitter 108 receives the input pattern of bits (PDATA) and outputs the input pattern of bits (PDATA) to the receiver 110. The input pattern of bits (PDATA) is also referred to as 'first data'. The buffer 116 receives and outputs the input pattern of bits (PDATA) to the CDR circuit 118. The CDR circuit 118 receives the input pattern of bits (PDATA) and outputs a recovered clock signal (RCLK). The PLL 114 generates a functional mode clock (FMCLK). The functional mode clock (FMCLK) is also referred to as 'reference clock signal'. The multiplexer 120 receives the recovered clock signal (RCLK), the functional mode clock (FMCLK), and a select signal (SS). The multiplexer 120 outputs an output clock (OCLK) to the serializer 122. The serializer 122 receives the output clock (OCLK), input data (INDATA) and outputs serial data (SDATA). The input data (INDATA) is also referred to as 'second data'. The driver circuit 124 receives and outputs the serial data (SDATA) to the oscilloscope 104.

The lock time measurement system 100 functions in first and second modes of operation. In the first mode of operation, the SERDES 102 outputs data timed by the recovered clock signal (RCLK) as the serial data (SDATA). The oscilloscope 104 receives the serial data (SDATA) and the input pattern of bits (PDATA) and outputs the lock time. The first mode of operation is also referred to as "test mode" of operation. In the second mode of operation, the SERDES 102 receives received data and generates the recovered clock signal (RCLK). The second mode of operation is also referred to as "normal mode" of operation. Thus, in the first mode of operation, the lock time measurement system 100 determines the lock time and in the second mode of operation, the lock time measurement system 100 transmits and receives data from the serial communication link.

In the first mode of operation, the SERDES 102 receives the select signal (SS) at a first logic state from an external circuit (not shown). In an example, the external circuit includes a micro-controller connected to the SERDES 102 and the first logic state is a logic high state. Further, in the first mode of operation, the SERDES 102 receives the enable signal (EN) at the first logic state from the external circuit.

The pattern generator 106 receives the enable signal (EN) at the first state and outputs the input pattern of bits (PDATA). In one embodiment, the pattern generator 106 is a bit error rate tester (BERT). Further, the bit error rate tester (BERT) outputs a sequence of bits at alternating logic high and logic low states as the input pattern of bits (PDATA). In one embodiment, the input pattern of bits (PDATA) is a sequence of '101010'. Furthermore, each sequence of alternating logic high and logic low state is referred to as a 'cycle' of the pattern generator 106.

The splitter 108 receives and outputs the input pattern of bits (PDATA) to the receiver 110. The splitter 108 transmits a copy of the input pattern of bits (PDATA) to the oscilloscope 104. The copy of the input pattern of bits (PDATA) is also referred to as 'third data'. Thus, the splitter 108 outputs the input pattern of bits (PDATA) to two distinct devices simultaneously. In one embodiment, the splitter 108 is a switch splitter.

The buffer 116 receives the input pattern of bits (PDATA) from the splitter 108 and outputs the input pattern of bits (PDATA) to the CDR circuit 118. Generally, the bandwidth limitation of the channel used for data transmission distorts the signal. The buffer 116 conditions the signal to reduce the amount of distortion in the signal. In one embodiment, the buffer 116 is a continuous time linear equalizer (CTLE). The CTLE receives the input pattern of bits (PDATA) and conditions the input pattern of bits (PDATA) to reduce errors and distortion in the input pattern of bits (PDATA).

The CDR circuit 118 receives the input pattern of bits (PDATA) and outputs the recovered clock signal (RCLK) based on the input pattern of bits (PDATA). A frequency of the recovered clock signal (RCLK) is matched with a frequency at which the input pattern of bits (PDATA) is received. The process of generation of the recovered clock signal (RCLK) based on the input pattern of bits (PDATA) by the CDR circuit 118 is well-known in the art. Further, the CDR circuit 118 utilizes certain time to synchronize a phase of the recovered clock signal (RCLK) with a phase of the input pattern of bits (PDATA). When the phase of the input pattern of bits (PDATA) is synchronized with the phase of the recovered clock signal (RCLK), the CDR circuit 118 is phase locked with the input pattern of bits (PDATA).

The multiplexer 120 receives the select signal (SS) at first logic state, the recovered clock signal (RCLK), and the functional mode clock (FMCLK). The multiplexer 120 outputs the recovered clock signal (RCLK) as output clock (OCLK) corresponding to the select signal (SS). The multiplexer 120 outputs the output clock (OCLK) at a frequency that matches the frequency of the recovered clock signal (RCLK). Further, a phase of the output clock (OCLK) matches the phase of the recovered clock signal (RCLK).

The serializer 122 receives the input data (INDATA) from the external circuit, and the output clock (OCLK) from the multiplexer 120. The serializer 122 outputs the input data (INDATA) serially as the serial data (SDATA), based on the output clock (OCLK). In one embodiment, the input data (INDATA) is a recurring sequence of a set of bits at alternating logic high and logic low states. Further, the input data (INDATA) is '101010'. The serializer 122 outputs a bit of the input data (INDATA) as the serial data (SDATA) at each clock edge of the output clock signal (OCLK), thereby matching a phase of the serial data (SDATA) with the phase of the output clock (OCLK). The process of serialization of input data (INDATA) by the serializer 122 based on the output clock signal (OCLK) is well-known in the art. Further, the serializer 122 outputs the serial data (SDATA) at a frequency that matches the frequency of the output clock (OCLK). Thus, the frequency and phase of the serial data (SDATA) match with the frequency and phase of the output clock (OCLK).

The driver circuit 124 receives the serial data (SDATA) from the serializer 122, conditions the serial data (SDATA), and outputs the serial data (SDATA) at a higher current to minimize distortion of the serial data (SDATA). The oscilloscope 104 receives the input pattern of bits (PDATA) from the splitter 108 and the serial data (SDATA) from the driver circuit 124. The oscilloscope 104 displays a delay time between the input pattern of bits (PDATA) and the serial data (SDATA). The delay time corresponds to a time delay between the input pattern of bits (PDATA) and the serial data (SDATA). When the CDR circuit 118 is phase-locked with the input pattern of bits (PDATA), the delay time attains a constant value. The time taken for the delay time to attain a constant value is referred to as the lock time of the CDR circuit 118. In one embodiment, the lock time is determined in terms of the cycles of the pattern generator 106. The number of cycles of the pattern generator 106 received by the CDR circuit 118 before the delay time attains a constant value, is referred to as the lock time. The lock time of the CDR circuit 118 is determined by way of a wave-scan mode of the oscilloscope 104.

In the second mode of operation, the SERDES 102 receives the select signal (SS) and the enable signal (EN) at a second logic state from the external circuit. In one embodiment, the second logic state is a logic low state. The transmitter 112 receives the second data from the external circuit and the functional mode clock (FMCLK) from the PLL 114. The transmitter 112 modifies and outputs the second data as the serial data based on the functional mode clock (FMCLK).

In operation, the SERDES 102 receives the select signal (SS) and enable signal (EN) from the micro-controller at logic high state. The bit error rate tester (BERT) outputs the input pattern of bits (PDATA) at a preset frequency. Further, the bit error rate tester (BERT) outputs a sequence of '101010' as the input pattern of bits (PDATA). The CDR circuit 118 receives the input pattern of bits (PDATA) and outputs the recovered clock signal (RCLK) at the preset frequency. The multiplexer 120 receives and outputs the recovered clock signal (RCLK) as the output clock signal (OCLK) at the preset frequency. The serializer 122 receives a sequence of '101010' as the input data (INDATA) from the external circuit. The serializer 122 outputs each bit of the input data (INDATA) serially as the serial data (SDATA) at the preset frequency. Further, the serializer 122 phase locks the serial data (SDATA) with the output clock signal (OCLK). The oscilloscope 104 receives the serial data (SDATA) by way of the driver circuit 124. Further, the oscilloscope 104 receives the input pattern of bits (PDATA) by way of the splitter 108 and outputs the delay time. The time taken for the delay time to attain a constant value is referred to as the lock time of the CDR circuit 118.

The SERDES 102 receives the select signal (SS) and enable signal (EN) from the micro-controller at a logic low state. The receiver 110 receives the received data as the input pattern of bits (PDATA) from the communication link (not shown). The CDR circuit 118 receives the input pattern of bits (PDATA) and outputs the recovered clock signal (RCLK). The serializer 122 receives the functional mode clock (FMCLK) as the output clock (OCLK) by way of the multiplexer 120. The serializer 122 further receives the input data (INDATA). The serializer 122 outputs the serial data (SDATA) to the external circuit.

Thus, the lock time measurement system 100 for the clock and data recovery circuit (CDR) utilizes an existing design of the multiplexer 120, the driver circuit 124, and the receiver 110 to output and monitor the recovered clock signal (RCLK). The accuracy of the measurement of the lock time is retained, since division or decoding of the recovered clock signal (RCLK) is not done. Further, the transmitter 112 and the receiver 110 used are in-built to a data transmission circuit and require no additional circuitry to handle the high-speed serial communication signals, thereby decreasing the complexity of the circuit. Further, this reduces the manufacturing costs of the serial data communication devices for which the lock time can be analyzed.

The terms first and second logic states have been used herein to distinguish before high and low signals. For example, the first logic state could signify a signal that is 0v while a second logic state would then indicate a signal that has a logical '1' value, with the actual voltage value for logic 1 depending on the circuit technology. The circuits described herein can also be designed using either positive or negative logic, so an active signal in one embodiment could be a logic '0' and an inactive signal would then have a logic value of '1'.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention.

What is claimed is:

1. A lock time measurement system comprising:
a receiver comprising a clock and data recovery (CDR) circuit that receives first data and outputs a recovered clock signal based on the first data; and
a transmitter that receives a reference clock signal and is connected to the CDR circuit for receiving the recovered clock signal, the transmitter comprising:
a multiplexer that receives the recovered clock signal and the reference clock signal, and outputs at least one of the recovered clock signal and the reference clock signal as an output clock signal; and
a serializer that receives second data and is connected to the multiplexer for receiving the output clock signal, and outputs serial data,
wherein the serial data and the first data are used for measuring a lock time of the CDR circuit.

2. The lock time measurement system of claim 1, further comprising a splitter, wherein the splitter receives the first data and outputs the first data to the receiver, and wherein the splitter further outputs third data based on the first data.

3. The lock time measurement system of claim 2, further comprising a pattern generator, wherein the pattern generator outputs the first data, and wherein the splitter is connected to the pattern generator for receiving the first data.

4. The lock time measurement system of claim 2, further comprising a measurement device, wherein the measurement device is connected to the transmitter and the splitter for receiving the serial data and the third data, respectively, and wherein the measurement device determines the lock time.

5. The lock time measurement system of claim 1, further comprising a phase locked loop (PLL), wherein the PLL outputs the reference clock signal.

6. The lock time measurement system of claim 1, wherein the receiver further comprises a buffer connected to the CDR circuit, and wherein the buffer receives and outputs the first data to the CDR circuit.

7. The lock time measurement system of claim 1, wherein the transmitter further comprises a driver circuit connected to the serializer, and wherein the driver circuit receives and outputs the serial data.

8. The lock time measurement system of claim 1, wherein the transmitter receives the second data from an external circuit.

9. A serializer-deserializer (SERDES) comprising:
a receiver comprising:
a clock and data recovery (CDR) circuit that receives first data and outputs a recovered clock signal based on the first data;
a phase locked loop (PLL) that outputs a reference clock signal; and
a transmitter that receives the reference clock signal and is connected to the CDR circuit for receiving the recovered clock signal, the transmitter comprising:
a multiplexer that receives the recovered clock signal and the reference clock signal, and outputs at least one of the recovered clock signal and the reference clock signal as an output clock signal; and
a serializer that receives second data and is connected to the multiplexer for receiving the output clock signal, and outputs serial data,
wherein the serial data and the first data are used for measuring a lock time of the CDR circuit.

10. The SERDES of claim 9, further comprising a splitter, wherein the splitter receives the first data and outputs the first data to the receiver, and wherein the splitter outputs third data based on the first data.

11. The SERDES of claim 10, further comprising a pattern generator, wherein the pattern generator outputs the first data, and wherein the splitter is connected to the pattern generator for receiving the first data.

12. The SERDES of claim 10, further comprising a measurement device, wherein the measurement device is connected to the transmitter and the splitter for receiving the serial data and the third data, respectively, and wherein the measurement device determines the lock time.

13. The SERDES of claim 9, wherein the receiver further comprises a buffer connected to the CDR circuit, and wherein the buffer receives and outputs the first data to the CDR circuit.

14. The SERDES of claim 9, wherein the transmitter further comprises a driver circuit connected to the serializer, and wherein the driver circuit receives and outputs the serial data.

15. The SERDES of claim 9, wherein the transmitter receives the second data from an external circuit.

* * * * *